(12) United States Patent
Potin et al.

(10) Patent No.: US 11,674,219 B1
(45) Date of Patent: Jun. 13, 2023

(54) METHOD FOR DENSIFYING COMPOSITE MATERTALS

(71) Applicant: SAFRAN CERAMICS, Le Haillan (FR)

(72) Inventors: Jean-François Daniel René Potin, Moissy Cramayel (FR); Arnaud Delehouze, Moissy Cramayel (FR); Stéphane Roger André Goujard, Moissy Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 17/913,731

(22) PCT Filed: Mar. 19, 2021

(86) PCT No.: PCT/FR2021/050463
§ 371 (c)(1),
(2) Date: Sep. 22, 2022

(87) PCT Pub. No.: WO2021/198582
PCT Pub. Date: Oct. 7, 2021

(30) Foreign Application Priority Data

Mar. 30, 2020 (FR) ...................................... 2003120

(51) Int. Cl.
*C23C 16/04* (2006.01)
*C23C 16/455* (2006.01)
(Continued)

(52) U.S. Cl.
CPC ............ *C23C 16/045* (2013.01); *B01D 53/24* (2013.01); *C04B 35/62873* (2013.01);
(Continued)

(58) Field of Classification Search
None
See application file for complete search history.

(56) References Cited

U.S. PATENT DOCUMENTS

| 6,849,105 B2 * | 2/2005 | Baudry | B01D 53/1493 |
| | | | 96/275 |
| 2008/0160192 A1 * | 7/2008 | Thebault | C23C 16/045 |
| | | | 427/249.2 |

FOREIGN PATENT DOCUMENTS

WO  WO 2006/077353 A1  7/2006

OTHER PUBLICATIONS

International Search Report as issued in International Patent Application No. PCT/FR2021/050463, dated Jul. 5, 2021.
(Continued)

*Primary Examiner* — Joel G Horning
(74) *Attorney, Agent, or Firm* — Pillsbury Winthrop Shaw Pittman LLP

(57) ABSTRACT

A method for densifying one or more porous substrates with pyrolytic carbon by chemical vapour infiltration, includes admitting, at the inlet of the densification furnace, a reactive gaseous phase including at least one pyrolytic carbon precursor; reacting at least a fraction of the reactive gaseous phase with the porous substrate or substrates; extracting, at the outlet of the densification furnace, gaseous effluents originating from the reactive gaseous phase; reintroducing, with the reactive gaseous phase admitted at the inlet of the densification furnace, at least a fraction of the gaseous effluents extracted at the outlet of the furnace, wherein the fraction of the gaseous effluents introduced with the reactive gaseous phase includes at least one polyaromatic hydrocarbon compound.

7 Claims, 1 Drawing Sheet

(51) Int. Cl.
*C23C 16/44* (2006.01)
*B01D 53/24* (2006.01)
*C04B 35/83* (2006.01)
*C04B 35/628* (2006.01)
*F16D 69/02* (2006.01)
*C23C 16/26* (2006.01)

(52) U.S. Cl.
CPC ........ *C04B 35/62884* (2013.01); *C04B 35/83* (2013.01); *C23C 16/26* (2013.01); *C23C 16/4412* (2013.01); *C23C 16/45593* (2013.01); *F16D 69/023* (2013.01); *C04B 2235/422* (2013.01); *C04B 2235/5248* (2013.01); *C04B 2235/5252* (2013.01); *C04B 2235/614* (2013.01); *F16D 2200/0052* (2013.01); *F16D 2200/0065* (2013.01)

(56) References Cited

OTHER PUBLICATIONS

International Preliminary Report on Patentability and the Written Opinion of the International Searching Authority as issued in International Patent Application No. PCT/FR2021/050463, dated Sep. 29, 2022.

* cited by examiner

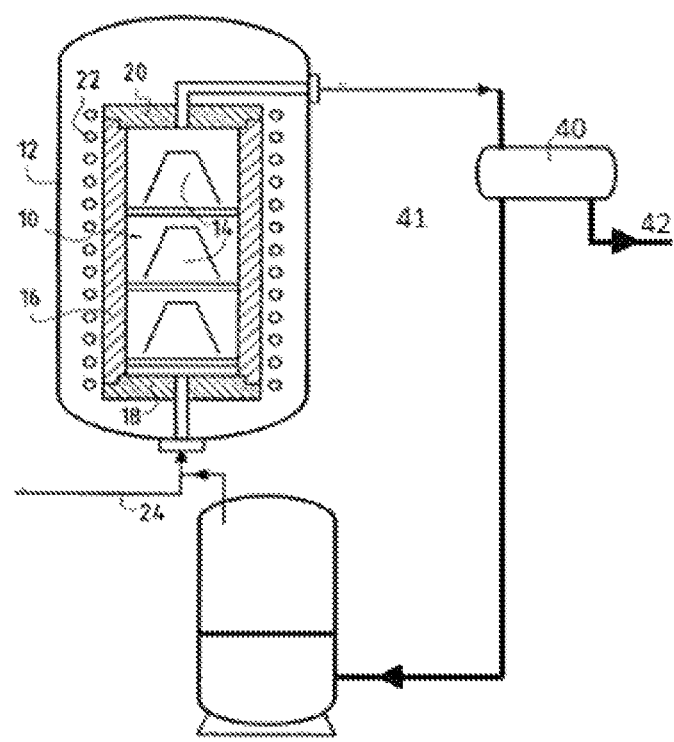

METHOD FOR DENSIFYING COMPOSITE MATERIALS

CROSS-REFERENCE TO RELATED APPLICATIONS

This application is the U.S. National Stage of PCT/FR2021/050463, filed Mar. 19, 2021, which in turn claims priority to French patent application number 2003120 filed Mar. 30, 2020. The content of these applications are incorporated herein by reference in their entireties.

TECHNICAL FIELD

The invention belongs to the field of densification of porous structures by chemical vapour infiltration and to the facilities for carrying out such densification. It makes an improvement to this densification technique as proposed in the prior art.

PRIOR ART

The densification of porous substrates by chemical vapour infiltration is known. In the methods used, the substrates are placed in a furnace, and the furnace is then supplied with a reactive gaseous phase, allowing the matrix to form in the pores of the substrates. The choice of the gas constituting the gaseous phase and the temperature and pressure conditions prevailing in the furnace determine the nature of the matrix formed. When forming a matrix of pyrogenic carbon, short linear hydrocarbons are generally used as the reactive gaseous phase.

The cost of the method is directly affected by the chosen nature of the reactive gaseous phase. Generally, the more carbon-rich the reactive gaseous phase, the higher the cost.

During a method for densifying a porous structure, only some of the reactive gaseous phase actually reacts in contact with the preform to deposit pyrocarbon.

The gaseous effluents recovered at the outlet of the densification furnace are composed of species initially present in the reactive gaseous phase that have not reacted and also of reaction products from the reactions of the reactive gaseous phase species with each other. The reaction products from the reactions of the reactive gaseous phase species with each other include, inter alia, aromatic hydrocarbons and polyaromatic hydrocarbons.

Separating the species initially present in the reactive gaseous phase that have not reacted from the gaseous effluents in order to reintroduce them with the reactive gaseous phase at the inlet of the densification furnace has been proposed, for example in WO 2006/077353.

Such recycling helps reduce the quantity of new reactive gaseous phase that is introduced, thereby reducing costs.

However, the polyaromatic hydrocarbons recovered at the outlet of the densification furnace are not upgraded in the methods of the prior art.

There remains a need to improve existing densification methods and, in particular, to overcome the abovementioned disadvantages.

DISCLOSURE OF THE INVENTION

The invention aims precisely to satisfy this need and for this purpose proposes a method for densifying one or more porous substrates with pyrolytic carbon by chemical vapour infiltration, comprising at least the following steps:

admitting, at the inlet of the densification furnace, a reactive gaseous phase comprising at least one pyrolytic carbon precursor;

reacting at least a fraction of the reactive gaseous phase with the porous substrate or substrates;

extracting, at the outlet of the densification furnace, gaseous effluents originating from the reactive gaseous phase;

reintroducing, with the reactive gaseous phase admitted at the inlet of the densification furnace, at least a fraction of the gaseous effluents extracted at the outlet of the furnace;

characterised in that the fraction of the gaseous effluents introduced with the reactive gaseous phase comprises at least one polyaromatic hydrocarbon compound.

A method as described above helps overcome the disadvantages of the methods of the prior art, reduce costs and also reduce the quantities of waste generated by a method, since some of it can be reused.

"Polyaromatic hydrocarbon compound" should be understood to mean a chemical species composed of carbon and hydrogen having more than one aromatic ring. For example, such polyaromatic hydrocarbon compounds suitable for the invention can be chosen from naphthalene, acenaphthylene, acenaphthene, fluorene, phenanthrene, anthracene, fluoranthene, pyrene, dibenzyl toluene and mixtures thereof.

The inventors have noted that the presence of a polyaromatic hydrocarbon compound with the reactive gaseous phase allows the densification of the substrates, even when less reactive gaseous phase is introduced into the densification furnace than in the methods of the prior art. In other words, introducing polyaromatic hydrocarbons into the densification furnace with the reactive gaseous phase helps reduce the quantity of reactive gaseous phase necessary for the densification of the substrates, and therefore helps reduce the cost of the method. The reduction in the quantity of the reactive gaseous phase is made possible by the very high carbon content of the polyaromatic hydrocarbons introduced with the reactive gaseous phase. Thus, the quantity of polyaromatic hydrocarbons introduced with the reactive phase makes it possible to provide equivalent carbon to a portion of the reactive gaseous phase, which can therefore be saved.

Moreover, a method as described above allows the polyaromatic hydrocarbons to be reused without the need for any prior transformation of the latter, which are reintroduced into the furnace with the reactive phase Preferably, the quantity of polyaromatic hydrocarbons introduced into the densification furnace with the reactive gaseous phase is relatively low in order to prevent fouling of the injection channels and, if applicable, of the preheating chamber. For example, the quantity of polyaromatic hydrocarbon introduced may be between 0.5% and 5.0% by weight of polyaromatic hydrocarbons in relation to the weight of the reactive gaseous phase. Preferably, the quantity of polyaromatic hydrocarbons introduced may be between 0.9% and 1.1% by weight of polyaromatic hydrocarbons in relation to the weight of the gaseous phase.

In one embodiment, the weight ratio between the reintroduced gaseous effluents and the gaseous phase is between 0.5% and 5.0%.

In one embodiment, the quantity of polyaromatic hydrocarbons introduced with the reactive gaseous phase varies as the densification of the porous substrates progresses.

Indeed, it has been noted that a high amount of polyaromatic hydrocarbon compounds at the start of densification allows better densification of the substrates, whereas at the end of densification, the flow of polyaromatic hydrocarbons may be reduced or even stopped in order to prevent soot from forming on the components to be densified. In one embodiment, the flow of polyaromatic hydrocarbons may be zero at the end of the method.

For example, the quantity of polyaromatic hydrocarbons introduced with the reactive gaseous phase may vary from 5.0% to 0.0% by weight relative to the reactive gaseous phase between the start and the end of the densification method.

In one embodiment, the quantity of polyaromatic hydrocarbons introduced at the start of infiltration is between 0.5% and 1.0% by weight relative to the weight of the reactive gaseous phase at the start of the method, and is then gradually reduced to zero at the end of the method. In one preferred embodiment, the quantity of polyaromatic hydrocarbons introduced is gradually reduced to zero approximately half-way through the method.

The inventors have noted that gradually reducing the quantity of polyaromatic hydrocarbons introduced during the method makes it possible to increase the amount of carbon present in the furnace at the start of the method and to prevent soot from being deposited at the end of the method, when the densification of the substrates is already at an advanced stage and it is no longer necessary to introduce a large quantity of carbon into the furnace.

"Reactive gaseous phase", should be understood to mean the pyrocarbon-generating species introduced into the densification furnace in gas form. In one embodiment of the invention, a carrier gas may be present to transport the reactive gaseous phase and the fraction of polyaromatic hydrocarbons injected into the furnace, before introduction into the densification furnace. If such a carrier gas does not take part in the densification reaction, it is not part of the "reactive gaseous phase" within the meaning of the invention.

The carrier gas may be chosen from an inert gas, for example dinitrogen or hydrogen, a gas taking part in the densification reaction, for example a hydrocarbon with fewer than four carbon atoms, or a mixture of two or more of these gases.

In one embodiment of the invention, the method further comprises a step of separating the compounds from the gaseous effluents extracted at the outlet of the furnace, which may be carried out by centrifugation, mechanical filtration, precipitation, decantation or a combination of these methods.

During such a step, the polyaromatic hydrocarbons are separated from the gaseous effluents obtained at the outlet of the densification furnace in order to allow them to be reinjected with the reactive gaseous phase.

The inventors have noted that introducing, with the reactive gaseous phase, a portion of the gaseous effluents comprising at least one polyaromatic hydrocarbon compound, allows the densification of substrates with pyrolytic carbon with a reactive gaseous phase that is poorer in carbon than in the methods of the prior art. This results in a method that has a lower cost than methods using reactive gaseous phases composed of pyrolytic carbon precursors having longer carbon chains.

Therefore, in one embodiment, the reactive gaseous phase may be composed on alkanes having up to 4 carbon atoms and preferably up to 3 carbon atoms. In other words, the reactive gaseous phase may comprise methane, ethane, propane, butane, butane isomers or a mixture of these compounds. Preferably, the reactive gaseous phase may comprise methane, ethane and/or propane.

Limiting the reactive gaseous phase to short-chain linear alkanes helps reduce the cost of same compared with gaseous phases composed of alkanes with longer chains used in the methods of the prior art.

In one embodiment, the method comprises a step of dissolving the polyaromatic hydrocarbons in a solvent. For example, the solvent used to dissolve the polyaromatic hydrocarbons may be dibenzyltoluene.

In other words, the fraction of the gaseous effluents introduced with the reactive phase may be mixed with the reactive gaseous phase before it is introduced into the densification furnace.

In one embodiment, the method further comprises a step of mixing the reactive gaseous phase with the fraction of the gaseous effluents comprising at least one polyaromatic hydrocarbon compound before the admission of the reactive gaseous phase into the densification furnace. Mixing the polyaromatic hydrocarbons with the reactive gaseous phase helps to prevent the polyaromatic hydrocarbons from recondensing and therefore to prevent fouling of the densification furnace. Moreover, this mixing operation, which is carried out prior to introduction into the densification furnace, helps to improve the homogeneity of the polyaromatic hydrocarbons in the reactive gaseous phase introduced into the reactor, and finally to reduce the quantity of carrier gas required.

In one embodiment, the porous substrate or substrates are carbon brake preforms.

BRIEF DESCRIPTION OF THE DRAWINGS

FIG. 1 is a schematic representation of a facility for implementing a method of the invention.

DESCRIPTION OF THE EMBODIMENTS

FIG. 1 shows, schematically, a chemical vapour infiltration facility intended more particularly for densifying porous substrates with a pyrolytic carbon matrix and for carrying out a method as described above.

A furnace 10 housed in a casing 12 receives porous substrates to be densified 14, for example fibrous preforms of components to be produced from carbon matrix composite material.

For example, the substrates to be densified may be preforms intended for manufacturing carbon brakes.

The furnace 10 is delimited by a wall 16 forming an armature, or susceptor, for example made from graphite, and by a bottom 18 and a cover 20. The susceptor 16 is coupled with an inductor 22, the furnace being heated essentially by radiation from the susceptor heated by inductive coupling with the inductor.

A reactive gaseous phase is introduced into the furnace, for example through the bottom 18 of the furnace 10, via a pipe 24. The reactive gaseous phase comprises one or more carbon precursors in gas form. As detailed above, the gaseous phase may comprise a linear alkane having up to 4 carbon atoms.

The effluent gas is extracted from the furnace 10 through the cover 20, by a pipe 26 connected to a pumping device 28 which ensures the gas circulates in the furnace 10, maintaining the desired reduced pressure inside the furnace.

A pyrolytic carbon matrix is formed in the pores of the substrates by decomposition of the gaseous precursor(s) contained in the reactive phase.

Reaction by-products are also formed in the furnace 10 and are collected in the effluent gas with a portion of the reactive gaseous phase which has not reacted, as well as the products obtained during the decomposition of the gaseous precursor, in particular dihydrogen $H_2$.

FIG. 1 also shows a treatment means 40 for the effluent gases collected through the cover 20. Such treatment means 40 allow the polyaromatic hydrocarbons to be separated from the other gaseous effluents.

The treatment means 40, for example a centrifuge, is connected to two outlet channels 41 and 42. The polyaromatic hydrocarbons separated from the other gaseous effluents by the treatment means 40 are collected via the channel 41 to a tank 30. The channel 41 may be heated by means of heating members that are not shown in FIG. 1, in order to prevent the polyaromatic hydrocarbons from condensing, which could result in tars being deposited in the channels.

In the embodiment shown, the polyaromatic hydrocarbons 33 are collected in a tank 30 after separation from the other effluent gases. The tank 30 is in fluid communication with the supply pipe 24 of the furnace 10.

For example, the polyaromatic hydrocarbons may be dissolved in a solvent in order to form a liquid oil. As indicated above, dibenzyltoluene is a preferred solvent for dissolving polyaromatic hydrocarbons.

The tank 30 is provided with a heating system that is not shown in FIG. 1, meaning that polyaromatic hydrocarbon vapours in equilibrium with the liquid polyaromatic hydrocarbons 33 in the tank 30 can exit through a pipe 31 at the top of the tank 30 and mix with the reactive gaseous phase in the supply pipe 24, before the reactive gaseous phase enters the furnace 10.

In order to enrich the gaseous phase with polyaromatic hydrocarbons, the method may comprise a step in which a carrier gas passes through a tank 30 containing the polyaromatic hydrocarbons. By adapting the pressure and temperature conditions in the tank, i.e., by choosing adequate temperature and pressure conditions, a physical equilibrium is created which causes the polyaromatic hydrocarbons to migrate into the gaseous phase from the liquid phase. This equilibrium depends on the temperature and the pressure in the tank, as well as on the concentration of the liquid phase and data pertaining to the polyaromatic hydrocarbons such as, for example, the vapour pressure of the polyaromatic hydrocarbons.

It is therefore possible to determine the temperature and pressure conditions required in the reactor in order to obtain a determined amount of polyaromatic hydrocarbons in the carrier gas. In other words, controlling the pressure and temperature conditions in the tank 30 makes it possible to control the flow of polyaromatic hydrocarbons loading the carrier gas, and therefore to control the flow of polyaromatic hydrocarbons introduced into the densification furnace.

In one embodiment of the invention, the pressure in the tank 30 may be between 10 and 100 mbar, preferably between 10 and 50 mbar in order to load a carrier gas present in the top part of the tank 30 with polyaromatic hydrocarbons.

In one embodiment of the invention, the temperature in the tank 30 may be between 50° C. and 150° C., preferably between 80 and 120° C. in order to load a carrier gas present in the top part of the tank 30 with polyaromatic hydrocarbons.

In one embodiment of the method, all of the channels are heated to a temperature of between 80° C. and 100° C. Heating the channels in this way helps to prevent the polyaromatic hydrocarbons from recondensing and therefore to prevent the polyaromatic hydrocarbons from forming soot that could clog the channels.

A weighing system 32 is arranged for the tank 30 in order to measure the flow of polyaromatic hydrocarbons exiting the tank 30 so that the amount of polyaromatic hydrocarbons introduced into the densification furnace 10 can be controlled.

The outlet channel 42 may be connected to other recycling means that are not shown, in order to recycle the portion of the gaseous effluents not comprising the polyaromatic hydrocarbons.

For example, a method as described above may be carried out in a facility for the gaseous densification of porous substrates with pyrolytic carbon comprising:
   a densification furnace;
   means for supplying the furnace with a reactive gaseous phase;
   means for extracting, from the furnace, the gaseous effluents originating from the reactive gaseous phase;
   means for separating the various compounds from the gaseous effluents and recovering at least one polyaromatic hydrocarbon compound;
   means for introducing a chosen quantity of a polyaromatic hydrocarbon into the furnace with the reactive gaseous phase.

In such a facility, the means for separating the various compounds from the gaseous effluents may be means for centrifugation, mechanical filtration, precipitation by acting on the temperature, decantation of the gaseous effluents, or a combination of these methods.

Preferably, the separation means are chosen from mechanical filtration, precipitation, decantation or a combination of these methods.

In such a facility, the separation means may be connected with a tank so that the polyaromatic hydrocarbons, separated from the gaseous effluents, can be stored.

A facility for carrying out the method may also comprise means for heating tank.

Indeed, heating the polyaromatic hydrocarbon compounds helps keep the latter in liquid form and prevents them from solidifying, which could be detrimental to the channels or to the tank, the polyaromatic hydrocarbon compounds being able to solidify in the form of tars or soot capable of clogging the channels.

A facility for carrying out the method may also comprise means for heating all of the channels of the facility.

This heating helps prevent the polyaromatic hydrocarbons from recondensing in the channels when they are conveyed, for example between the separation means and their reintroduction into the furnace or, if applicable, the tank. Preventing the polyaromatic hydrocarbons from recondensing in the form of soot helps increase the service life of the facility.

Preferably, a facility for carrying out the method has no apparatus for transforming the polyaromatic hydrocarbons, because the latter do not need to be transformed in order to be reintroduced into the furnace.

For example, such a facility may further comprise a means for mixing the reactive gaseous phase with the polyaromatic hydrocarbon compounds before supplying the reactive gaseous phase to the furnace.

In a facility for carrying out the method, the reactive gaseous phase conveyed to the densification furnace may be brought into contact with the vapours of the polyaromatic hydrocarbon compounds produced by heating a tank containing them.

A facility for carrying out the method may also comprise means for adjusting the flow of polyaromatic hydrocarbons as the densification of the porous substrates progresses.

For example, a tank containing the polyaromatic hydrocarbon compounds may be provided with a weighing system allowing the evaporation of the polyaromatic hydrocarbon compounds to be monitored over time.

Such a tank may contain the polyaromatic hydrocarbons in solution in an oil. For example, dibenzyltoluene may be used as the solvent for the polyaromatic hydrocarbons.

For example, the tank heating temperature may be controlled in order to obtain the desired polyaromatic hydrocarbon compound gas flow.

The invention claimed is:

1. A method for densifying one or more porous substrates with pyrolytic carbon by chemical vapour infiltration, comprising:
   admitting, at an inlet of a densification furnace, a reactive gaseous phase comprising at least one pyrolytic carbon precursor;
   reacting at least a fraction of the reactive gaseous phase with the one or more porous substrates;
   extracting, at an outlet of the densification furnace, gaseous effluents originating from the reactive gaseous phase;
   reintroducing, with the reactive gaseous phase admitted at the inlet of the densification furnace, at least a fraction of the gaseous effluents extracted at the outlet of the furnace;
   wherein the fraction of the gaseous effluents introduced with the reactive gaseous phase comprises at least one polyaromatic hydrocarbon compound.

2. The densification method according to claim 1, in which the at least one polyaromatic hydrocarbon compound is chosen from naphthalene, acenaphthylene, acenaphthene, fluorene, phenanthrene, anthracene, fluoranthene, pyrene, dibenzyl toluene and mixtures thereof.

3. The densification method according to claim 1, further comprising separating the compounds from the gaseous effluents extracted at the outlet of the furnace, which is carried out by centrifugation, mechanical filtration, precipitation, decantation or a combination of these methods.

4. The method according to claim 1, wherein the fraction of the gaseous effluents is mixed with the reactive gaseous phase before it is introduced into the densification furnace.

5. The method according to claim 1, wherein a weight ratio between the reintroduced gaseous effluents and the reactive gaseous phase is between 0.5% and 5.0%.

6. The method according to claim 1, wherein the reactive gaseous phase comprises methane, ethane, propane, butane, a butane isomer or a mixture of these compounds.

7. The method according to claim 1, wherein the one or more porous substrates are carbon brake preforms.

* * * * *